(12) United States Patent
Park et al.

(10) Patent No.: US 6,730,539 B2
(45) Date of Patent: May 4, 2004

(54) METHOD OF MANUFACTURING SEMICONDUCTOR DEVICE PACKAGE

(75) Inventors: Chan Wang Park, Sungnam (KR); Joon Ho Yoon, Seoul (KR)

(73) Assignee: Samsung Electro-Machanics Co., Ltd., Kyungki-do (KR)

(*) Notice: Subject to any disclaimer, the term of this patent is extended or adjusted under 35 U.S.C. 154(b) by 0 days.

(21) Appl. No.: 10/327,922

(22) Filed: Dec. 26, 2002

(65) Prior Publication Data
US 2003/0194855 A1 Oct. 16, 2003

(30) Foreign Application Priority Data
Apr. 11, 2002 (KR) .......................................... 2002-19823

(51) Int. Cl.[7] .......................... H01L 21/44; H01L 21/48; H01L 21/50
(52) U.S. Cl. ........................ 438/106; 438/124; 438/127
(58) Field of Search .................. 438/106, 124, 438/127

(56) References Cited

U.S. PATENT DOCUMENTS 6,204,089 B1    3/2001    Wang
6,333,252 B1 *  12/2001   Jung et al. .................. 438/612
6,503,779 B2 *  1/2003    Miyazaki .................... 438/106

* cited by examiner

Primary Examiner—John F. Niebling
Assistant Examiner—Angel Roman
(74) Attorney, Agent, or Firm—Lowe Hauptman Gilman & Berner LLP

(57) ABSTRACT

A method of manufacturing a semiconductor device package includes forming a patterned photoresist film with windows for exposing a plurality of connection bump areas on a conductive substrate, forming metal plating layers on the connection bumps area using the photoresist film, and forming first gold plating layers on the metal plating layers. The metal plating layers prevent the diffusion of the first gold plating layers into the conductive substrate. According to the method, high-qualified conductive layers are formed on the connection bumps by a simplified manufacturing process. Further, connection bumps having an upper part in an almost hemispherical shape are formed on the first gold plating layers, thereby improving the reliability of the semiconductor device package.

11 Claims, 8 Drawing Sheets

METHOD OF MANUFACTURING SEMICONDUCTOR DEVICE PACKAGE

BACKGROUND OF THE INVENTION

1. Field of the Invention

The present invention relates to a method of manufacturing a semiconductor device package, and more particularly to a method of manufacturing a semiconductor device package, in which an electrode surface is formed on a conductive layer of a conductive substrate, thereby miniaturizing the semiconductor device package and simplifying its manufacturing process.

2. Description of the Related Art

Generally, semiconductor devices such as diodes are packaged and these packaged devices are then mounted on a printed circuit board. Structurally, this package easily connects terminals of the semiconductor device to corresponding signal patterns of the printed circuit board and serves to protect the semiconductor device from external stresses, thereby improving reliability of the package.

In order to satisfy recent trends toward miniaturization of semiconductor products, the semiconductor chip packages have also been miniaturized. Therefore, a chip scale package (also referred to as a "Chip Size Package") has been introduced.

FIG. 1 is a schematic cross-sectional view of a conventional chip scale package. The structure of the chip scale package 10 of FIG. 1 employs a ceramic substrate 1 and is a diode package with two terminals.

With reference to FIG. 1, two via holes, i.e., a first via hole 2a and a second via hole 2b, are formed on the ceramic substrate 1. The first and the second via holes 2a and 2b are filled with conductive material so as to electrically connect the upper surface of the substrate 1 to the lower surface of the substrate 1. Then, a first and a second upper conductive lands 3a and 3b are formed on the upper surfaces of the first and the second via holes 2a and 2b, respectively. A first and a second lower conductive lands 4a and 4b are formed on the lower surfaces of the first and the second via holes 2a and 2b, respectively. The second upper conductive land 3b is directly connected to a terminal formed on the lower surface of the diode 5, i.e., a mounting surface of the diode 5 on a printed circuit board, and the first upper conductive land 3a is connected to the other terminal formed on the upper surface of the diode 5 by a wire 7. A molding part 9 using conventional resin is formed on the upper surface of the ceramic substrate 1 including the diode 5 in order to protect the diode 5 from external stresses. Thereby, the manufacture of the package 10 is completed.

The manufactured diode package 10 is mounted on a printed circuit board by a reflow soldering. That is, the diode package 10 is mounted on the printed circuit board by arranging the lower conductive lands 4a and 4b of the package 10 on each of corresponding signal patterns of the printed circuit board and by then connecting the lower conductive lands 4a and 4b to the signal patterns of the printed circuit board by the soldering.

As shown in FIG. 1, the conventional semiconductor device package usually employs the ceramic substrate. The ceramic substrate is high-priced, thereby increasing the production cost of the semiconductor device package. Further, the via holes of the ceramic substrate are formed by perforating the ceramic substrate by a machine work, thereby imposing a limit in miniaturizing the diameter of the via holes. Therefore, an area as large as the total areas of the via holes is further required. Since the substrate has a large size so as to satisfy the aforementioned conditions, the size of the substrate imposes a limit in miniaturizing the package.

The upper conductive lands, which are encapsulated by the resin molding part, are hexahedral. In this case, gaps are easily generated in an interface between each angle of the upper conductive land and the resin molding part. External dust or moisture is infiltrated into the semiconductor device package through the gaps, thereby deteriorating the reliability of the semiconductor device package. Sometimes, these gaps may cause more serious problems of the package according to the great difference of coefficient of thermal expansion between a resin composite of the resin molding part and a metal material of the upper conductive lands.

Accordingly, a chip scale package, which can solve the aforementioned problems without the ceramic substrate, simplify its manufacturing process and improve its reliability, and a method of manufacturing the chip scale package, have been demanded.

SUMMARY OF THE INVENTION

Therefore, the present invention has been made in view of the above problems, and it is an object of the present invention to provide a method of manufacturing a semiconductor device package, in which almost hemispherical metal bumps are formed on an upper surface of a conductive substrate, thereby improving the reliability of the semiconductor device package.

It is another object of the present invention to provide a method of manufacturing a semiconductor device package, in which successive plating steps are collectively performed at once, thereby simplifying the manufacturing process.

In accordance with the present invention, the above and other objects can be accomplished by the provision of a method of manufacturing a semiconductor device package with a plurality of connection bumps. The method comprises the steps of preparing a conductive substrate, forming a patterned photoresist film with windows for exposing a plurality of connection bump areas on the conductive substrate, forming metal plating layers on the connection bumps area using the photoresist film, forming first gold plating layers on the metal plating layers, forming a plurality of connection bumps on the first gold plating layers, each of the connection bumps having an upper part in an almost hemispherical shape, forming second gold plating layers on the upper surfaces of the connection bumps, removing the photoresist film, and mounting a semiconductor device on the conductive substrate so that terminals of the semiconductor device are electrically connected to each of the connection bumps of the conductive substrate, forming a resin molding part on the upper surface of the conductive substrate including the semiconductor device, and exposing the first gold plating layers by removing the conductive substrate and the metal plating layers.

The present invention may be variously modified according to the alignment of the terminals of the semiconductor device. That is, in accordance with one aspect of the present invention, in case that the semiconductor device has a terminal on its one surface and a terminal on it's other opposing surface, the connection bump areas are two in number and the connection bumps are two in number. Further, in this case, in the step of mounting the semiconductor device on the conductive substrate, the semiconductor device is mounted on the conductive substrate so that one terminal of the semiconductor device is directly connected to one connection bump, and then the other terminal of the semiconductor device is connected to the other connection bump by a wire.

In accordance with another aspect of the present invention, in case that the semiconductor device has a plurality of terminals on its one surface, a plurality of connection bumps are formed on the conductive substrate according to the alignment of the terminals of the semiconductor device. The terminals of the semiconductor device are directly mounted on each of the connection bumps of the conductive substrate.

Preferably, the conductive substrate may be made of copper (Cu) with an excellent etching rate.

Further, preferably, the metal plating layers may be made of nickel (Ni), and the connection bumps may be made of nickel (Ni). Particularly, the metal plating layers are interposed between the first gold plating layers and the conductive substrate, and prevent the diffusion of the first gold plating layers into the conductive substrate, thereby providing an excellent electrical and mechanical interconnection in mounting the semiconductor device package on a printed circuit board.

At least one selected from the metal plating layers, the connection bumps, the first gold plating layers, and the second gold plating layers, may be formed by an electroplating method, thereby easily forming the connection bumps by collective plating steps.

The cross-section of each of the connection bumps is a mushroom shape. In case that the height of the connection bumps is more than the thickness of the photoresist film by the plating method, the upper parts of the connection bumps are almost hemispherical. In order to achieve the shaped connection bumps, preferably, the thickness of the metal plating layers and the thickness of the first gold plating layers are less than that of the photoresist film. Further, the height of the connection bumps is more than the thickness of the photoresist film, and almost hemispherical upper parts of the connection bumps cover neighboring areas of the upper surface of the conductive substrate. These connection bumps are more closely interfaced with the resin molding part, thereby minimizing the generation of gaps in interfaces between the resin molding part and the connection bumps.

Preferably, the step of exposing the first gold plating layers is carried out by sequentially etching the conductive substrate and the metal plating layers. More preferably, after removing the conductive substrate and the metal plating layers, the resin molding part is partially removed so that the side surfaces of the first gold plating layers are exposed.

In accordance with yet another aspect of the present invention, the method of manufacturing the semiconductor device package is applied to a method of manufacturing a plurality of semiconductor device packages. The method of manufacturing a plurality of the semiconductor device packages further comprises, after exposing the first gold plating layers, the step of dicing the conductive substrate including a plurality of the semiconductor device packages mounted thereon into package units, each package unit including one semiconductor device.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Hereinafter, preferred embodiments of the present invention will be described in detail with reference to the annexed drawings.

Figure 2:
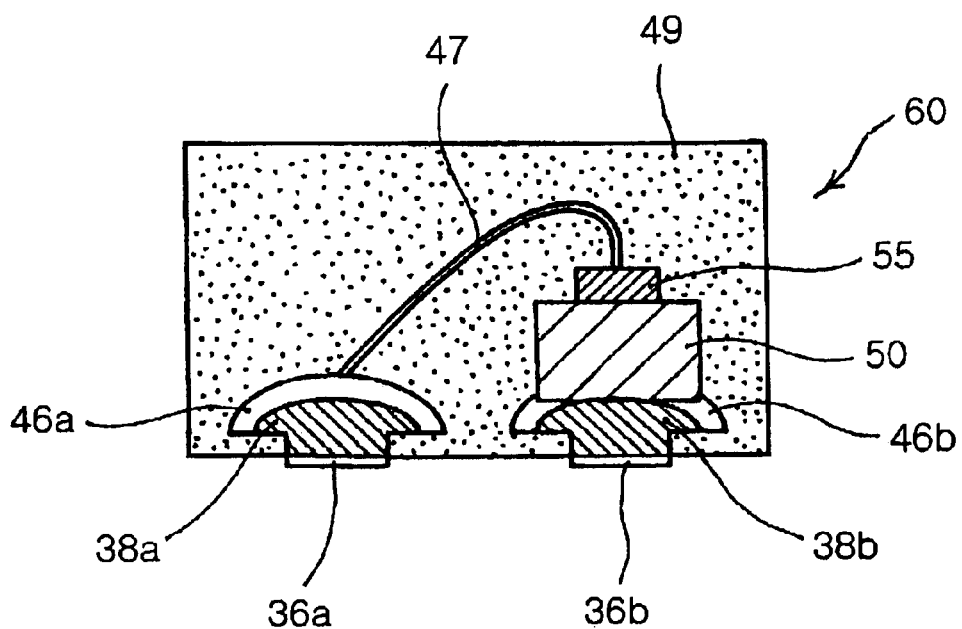
FIG. 2 is a cross-sectional view of a semiconductor device package, which is obtained by a manufacturing method in accordance with the present invention.

FIG. 2 is a cross-sectional view of a diode package 60, which is obtained by a manufacturing method in accordance with the present invention.

With reference to FIG. 2, the diode package 60 comprises a diode 50. The diode 50 comprises an upper terminal 55 formed on its upper surface and a lower terminal (not shown) formed on its lower surface. Herein, the lower terminal is formed throughout the whole lower surface of the diode 50. Similarly to the conventional semiconductor device package of FIG. 1, the lower terminal of the diode 50 is directly mounted on a connection bump 38b, and the upper terminal 55 of the diode 50 is connected to another connection bump 38a by a wire 47. Herein, gold (Au) plating layers 46a and 46b are formed on each of the connection bumps 38a and 38b, thereby forming a conductive layer of high quality on the connection bumps 38a and 38b.

Figure 1:
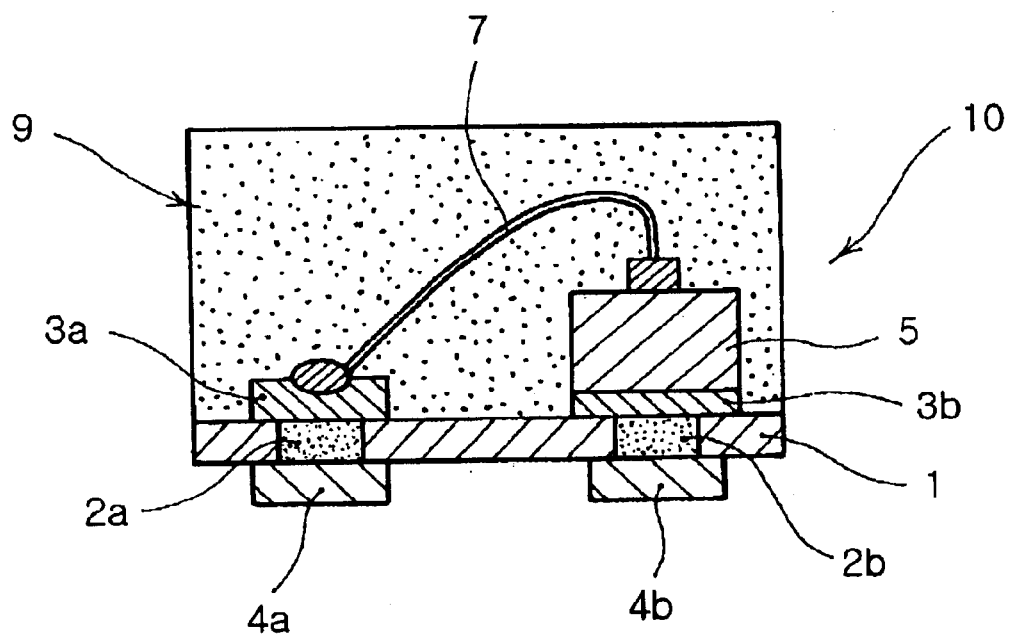
FIG. 1 is a cross-sectional view of a conventional semiconductor device package.

However, differing from the conventional semiconductor device package of FIG. 1, the diode package 60 in accordance with the present invention does not employ a ceramic substrate or a via hole structure. As shown in FIG. 2, the diode package 60 comprises two connection bumps 38a and 38b, each having a cross-section of a mushroom shape. That is, the connection bumps 38a and 38b are approximately hemispherical. The connection bump 38a includes a first gold plating layer 36a formed on its lower surface and the aforementioned second gold plating layer 46a formed on its upper surface. Also, the connection bump 38b includes a first gold plating layer 36b formed on its lower surface and the aforementioned second gold plating layer 46b formed on its upper surface. Therefore, since conductive layers of high quality are formed each of the connection bumps 38a and 38b, the connection bumps 38a and 38b are more stably connected to each terminal of the diode 50.

In this structure of the diode package 60, the connection bumps 38a and 38b are hemispherical, thereby effectively preventing formation of gaps on interfaces between a resin molding part 49 and the connection bumps 38a and 38b (Especially, the second gold plating layers 46a and 46b) in a molding step such as an EMC molding method. The bump structure of the conventional semiconductor device package is angular. Therefore, in the conventional case, when a resin molding part is formed on the connection bumps by resin with a predetermined fluidity, the resin cannot smoothly flow on the angular parts of the connection bumps, thereby generating gaps on the interfaces with the resin molding part and the angular parts of the connection bumps. However, the package 60 of the present invention comprises almost hemispherical connection bumps 38a and 38b, thereby uniformly distributing the resin on the interfaces between the resin molding part 49 and the connection bumps 38a and 38b, and solving the conventional gap problems. That is, the hemispherical connection bumps 38a and 38b can be more closely interfaced with the resin of the resin molding part 49.

In order to obtain the aforementioned connection bumps 38a and 38b, a photoresist film, which is patterned to have windows for exposing connection bump areas, is formed on the upper surface of the conductive substrate. Then, a gold plating layer is formed on the photoresist film. However, when the gold plating layer directly contacts the conductive substrate made of copper (Cu), a gold ingredient of the gold plating layer is diffused into the conductive substrate, thereby hindering the formation of the connection bumps with a high qualified gold plating layer. Therefore, in this preferred embodiment of the present invention, a metal plating layer made of nickel (Ni) or the like is formed on the photoresist film. Then, the gold plating layer is formed on the metal plating layer, thereby obtaining the gold plating layer of high quality. Further, the metal plating layer and the gold plating layer are formed by a collective plating step, thereby simplifying the manufacturing process of the package.

FIGS. 3a through 3f are cross-sectional views illustrating each step of a method of manufacturing a semiconductor device package in accordance with a preferred embodiment of the present invention.

Hereinafter, with reference to FIGS. 3a through 3f, the method of manufacturing the semiconductor device package in accordance with the present invention is described in detail.

Figure 3A:
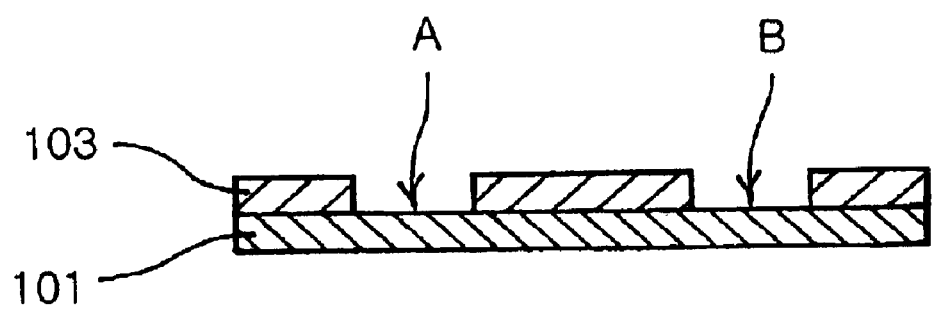
FIGS. 3a through 3f are cross-sectional views illustrating each step of a method of manufacturing a semiconductor device package in accordance with a preferred embodiment of the present invention.

As shown in FIG. 3a, a conductive substrate 101 is prepared. Then, a patterned photoresist film 103 with windows for exposing a plurality of connection bump areas A and B is formed on the conductive substrate 101. As described above, the number and the location of a plurality of the connection bump areas A and B may be modified according to the number and the alignment of terminals of a semiconductor device to be packaged.

Figure 3B:
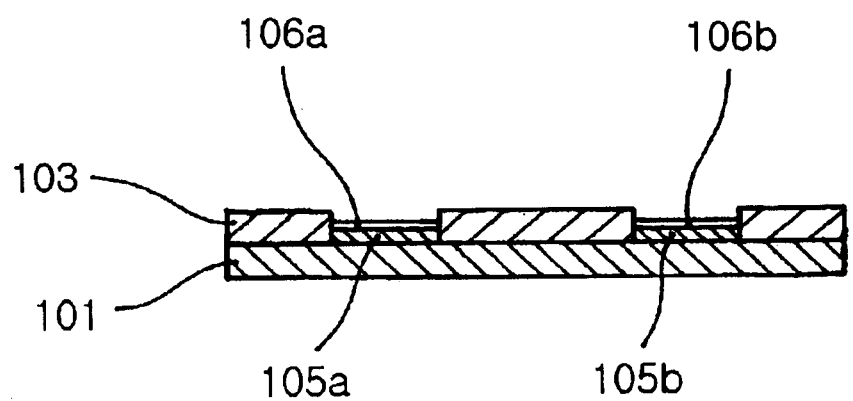

As shown in FIG. 3b, metal plating layers 105a and 105b are formed on each of the connection bump areas A and B exposed through the photoresist film 103. Then, first gold plating layers 106a and 106b are formed on each of the metal plating layers 105a and 105b. The first plating layers 106a and 106b serve to provide conductive layers of high quality. The obtained conductive layers are connected to each of patterns of a printed circuit board of the semiconductor device package.

The metal plating layers 105a and 105b are made of material, which can prevent the diffusion of the first gold plating layers 106a and 106b into the conductive substrate 101. The metal plating layers 105a and 105b are formed by an electroplating method the same as those for forming the first gold plating layers 106a and 106b and the connection bumps in a subsequent step. Preferably, the metal plating layers 105a and 105b are made of nickel (Ni) the same as that of the connection bumps. Further, preferably, the metal plating layers 105a and 105b, and the first gold plating layers 106a and 106b have a thickness less than that of the photoresist film 103. Particularly, the metal plating layers 105a and 105b have a thickness of approximately 1 $\mu$m to 5 $\mu$m, and the first gold plating layers 106a and 106b have a thickness of approximately 0.08 $\mu$m to 3 $\mu$m. However, the thickness of the metal plating layers 105a and 105b, and the first gold plating layers 106a and 106b are not limited thereto.

Figure 3C:
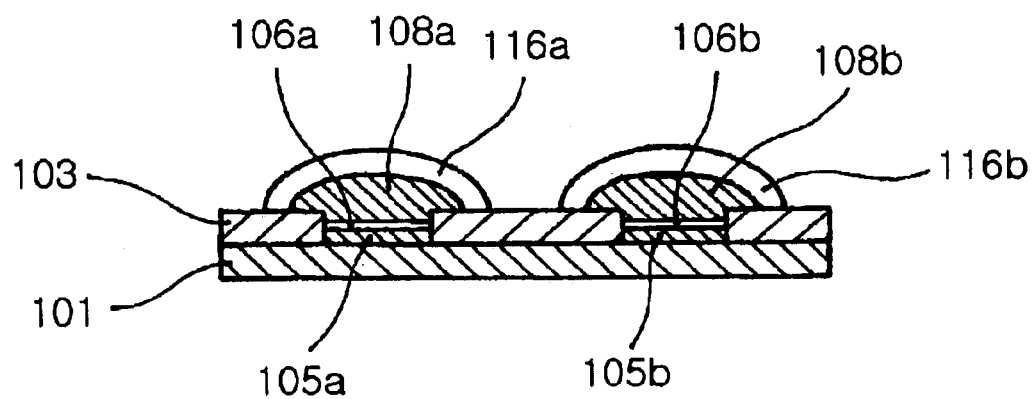

As shown in FIG. 3c, connection bumps 108a ad 108b in an almost hemispherical shape are formed on each of the first gold plating layers 106a and 106b. Then, second gold plating layers 116a and 116b are formed on each of the upper surface of the connection bumps 108a and 108b. Herein, the connection bumps 108a and 108b are made of nickel (Ni) or alloy including nickel (Ni). Further, preferably, the connection bumps 108a and 108b have a thickness more than that of the photoresist film 103, thereby coating parts of the upper surface of the photoresist film 103, which are adjacent to the connection bumps 108a and 108b, with the upper surfaces of the connection bumps 108a and 108b. As described above, these connection bumps 108a and 108b are more closely interfaced with a resin molding part formed by a subsequent molding step, thereby minimizing the generation of gaps at the interfaces between the resin molding part and the connection bumps and improving the reliability of the semiconductor device package.

Figure 3D:
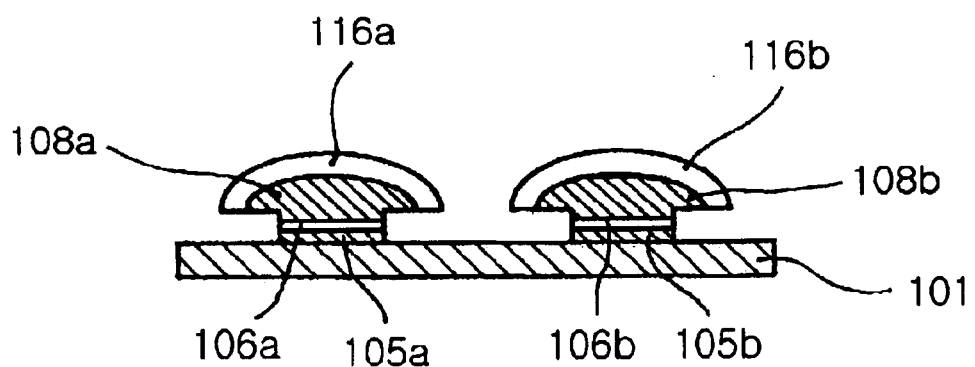
Figure 3E:
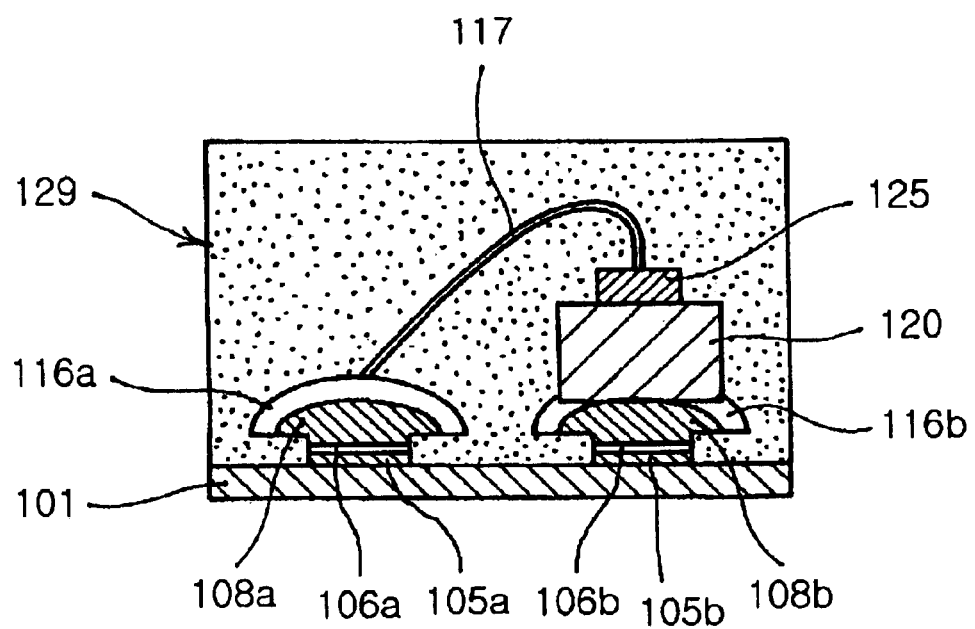

As shown in FIG. 3d, the photoresist film 103 is removed by lifting off the photoresist film 103. After removing the photoresist film 103, the cross-section of each of the connection bumps 108a and 108b is shaped as a mushroom. As shown in FIG. 3e, a semiconductor device 120 with an upper terminal 125 formed on its upper surface and a lower terminal on formed on its lower surface is mounted on the conductive substrate 101 so that the lower terminal is directly mounted on one connection bump 108b. Herein, the lower terminal of the semiconductor device 120 is a conductive layer formed throughout the whole lower surface of semiconductor device 120. The upper terminal 125 of the semiconductor device 120 is connected to the other connection bump 108a by a wire 117. A resin molding part is formed on the whole surface of the conductive substrate 101 including the semiconductor device 120. Herein, the resin molding part is formed by a conventional EMC molding step.

Figure 3F:
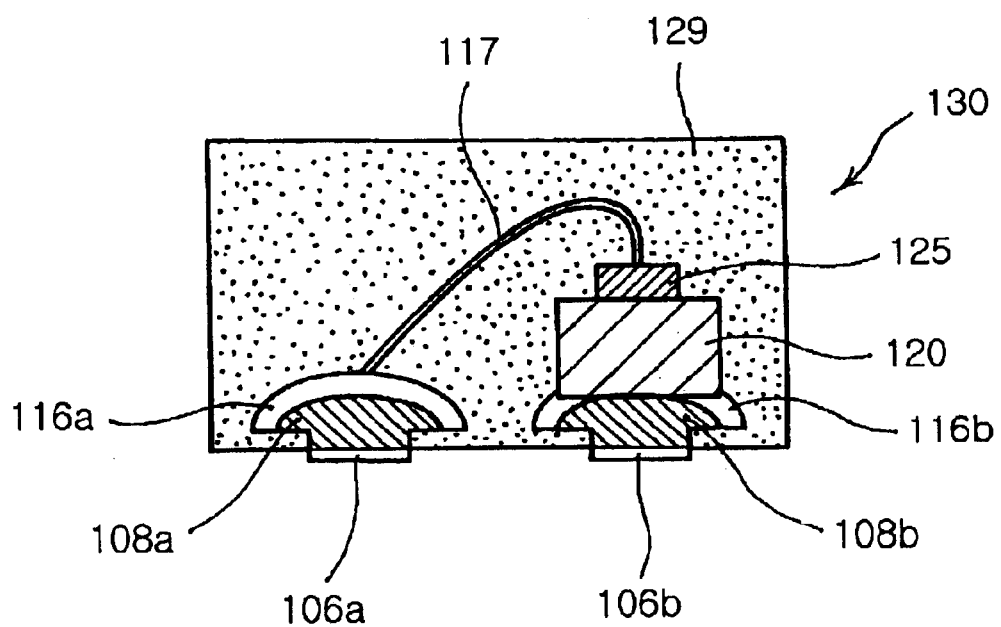

Finally, as shown in FIG. 3f, the conductive substrate 101 and the metal plating layers 105a and 105b are removed by an etching process. The metal plating layers 105a and 105b serve to protect the first gold plating layers 106a and 106b of the connection bumps 108a and 108b from external stresses prior to removing the metal plating layers 105a and 105b. Thereby, the first gold plating layers 106a and 106b of the connection bumps 108a and 108b are exposed to the outside. More preferably, in order to expose the whole side surfaces of the first plating layers 106a and the 106b and parts of the side surfaces of the connection bumps 108a and 108b, the resin molding part 129 may be partially removed.

In accordance with the method of manufacturing the semiconductor device package of the present invention, the metal plating layers 105a and 105b are formed between the conductive substrate 101 and each of the first gold plating layers 106a and 106b, thereby preventing the diffusion of the first gold plating layers 106a and 106b into the conductive substrate 101 and providing the connection bumps 108a and 108b with high qualified gold conductive layers. Differing from the above-described method of manufacturing the semiconductor device package of the present invention, in case that the metal plating layers 105a and 105b made of nickel (Ni) are not formed on the conductive substrate 101, the first gold plating layers 106a and the 106b are diffused into the conductive substrate 101. Therefore, in case that the metal plating layers 105a and 105b are not formed on the conductive substrate 101, after the etching step of removing the conductive substrate 101, another gold plating layer must be further formed on the lower surfaces of the connection bumps by an electroless-plating. In the latter, it is difficult to simplify the manufacturing process of the semiconductor device package. That is, it is difficult to collectively form all the metal layers by a plating step.

Further, the present invention comprises the connection bumps, which are more closely interfaced with the resin molding part, thereby minimizing the generation of gaps in the interface between the connection bumps and the resin molding part. Therefore, the present invention prevents impurities such as dust or moisture from being infiltrated into the semiconductor device package through the gaps.

The aforementioned method of manufacturing the semiconductor device package in accordance with the present invention may be applied to a method of manufacturing a plurality of semiconductor device packages. That is, a patterned photoresist film with windows for exposing connection bump areas of a plurality of semiconductor devices is formed on a conductive substrate. The same as the aforementioned method of the present invention, metal plating layers, first gold plating layers, connection bumps, and second gold plating layers are formed in order. A plurality of the semiconductor devices are mounted on the conductive substrate by die bonding and wire bonding steps. Then, a resin molding part is formed on the conductive substrate including plural semiconductor devices. After exposing the first gold plating layers, the conductive substrate including plural semiconductor devices is diced into package units, thereby completing the manufacture of a plurality of semiconductor device packages.

As apparent from the above description, the present invention provides a method of manufacturing a semiconductor device package, in which almost hemispherical metal bumps are formed on the upper surface of the conductive substrate, thereby minimizing the generation of gaps in interfaces between the resin molding part and the connection bumps and improving the reliability of the semiconductor device package. Further, the metal plating layers are formed on the conductive substrate prior to forming the first gold plating layers of the connection bumps, thereby forming high-qualified conductive layers on the connection bumps. Moreover, successive plating steps are collectively performed at once, thereby simplifying the manufacturing process of the semiconductor device package.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a semiconductor device package with a plurality of connection bumps, said method comprising the steps of:

preparing a conductive substrate;

forming a patterned photoresist film with windows for exposing a plurality of connection bump areas on the conductive substrate;

forming metal plating layers on the connection bump areas using the photoresist film;

forming first gold plating layers on the metal plating layers;

forming a plurality of connection bumps on the first gold plating layers, each of said connection bumps having an upper part in a substantially hemispherical shape;

forming second gold plating layers on upper surfaces of the connection bumps;

removing the photoresist film, and mounting a semiconductor device on the conductive substrate so that terminals of the semiconductor device are electrically connected to each of the connection bumps of the conductive substrate;

forming a resin molding part on an upper surface of the conductive substrate including the semiconductor device; and exposing the first gold plating layers by removing the conductive substrate and the metal plating layers and partially removing the resin molding part so that side surfaces of the first gold plating layers are exposed.

2. A method of manufacturing a semiconductor device package with a plurality of connection bumps, said method comprising the steps of:

preparing a conductive substrate;

forming a patterned photoresist film with windows for exposing a plurality of connection bump areas on the conductive substrate:

forming metal plating layers on the connection bump areas using the photoresist film;

forming first gold plating layers on the metal plating layers;

forming a plurality of connection bumps on the first gold plating layers, each of said connection bumps having an upper pant in a substantially hemispherical shape;

forming second gold plating layers on upper surfaces of the connection bumps;

removing the photoresist film, and mounting a semiconductor device on the conductive substrate so that terminals of the semiconductor device are electrically connected to each of the connection bumps of the conductive substrate;

forming a resin molding part on an upper surface of the conductive substrate including the semiconductor device; and exposing the first gold plating layers by removing the conductive substrate and the metal plating layers;

wherein the semiconductor device comprises first and second terminals formed on opposite surfaces of said semiconductor device, respectively, and the connection bumps are two, and wherein the step of mounting the semiconductor device on the conductive substrate comprises the sub-steps of;

mounting the semiconductor device on the conductive substrate so that said first terminal of the semiconductor device is directly connected to one connection bump; and connecting the second terminal of the semiconductor device to the other connection bump by a wire.

3. The method of manufacturing the semiconductor device package as set forth in claim 1, wherein the conductive substrate is made of copper (Cu).

4. The method of manufacturing the semiconductor device package as set forth in claim 1, wherein the metal plating layers are made of nickel (Ni).

5. The method of manufacturing the semiconductor device package as set forth in claim 1, wherein the connection bumps are made of nickel (Ni).

6. The method of manufacturing the semiconductor device package as set forth in claim 1, wherein at least one selected from the metal plating layers, the connection bumps, the first gold plating layers, and the second gold plating layers are formed by an electroplating method.

7. The method of manufacturing the semiconductor device package as set forth in claim 1, wherein the thickness of the metal plating layers and the thickness of the first gold plating layers are less than that of the photoresist film.

8. The method of manufacturing the semiconductor device package as set forth in claim 1, wherein the height of the connection bumps is more than the thickness of the photoresist film, and said substantially hemispherical upper parts of the connection bumps cover neighboring areas of the upper surface of the conductive substrate.

9. The method of manufacturing the semiconductor device package as set forth in claim 1, wherein the step of exposing the first gold plating layers comprises sequentially etching the conductive substrate and the metal plating layers.

10. The method of manufacturing the semiconductor device package as set forth in claim 1, wherein in the step of forming the photoresist film, said patterned photoresist film is formed with windows for exposing connection bump areas of a plurality of semiconductor devices, and in the step of mounting the semiconductor device, said plurality of the semiconductor devices are formed to be spaced from each other by a designated distance on the connection bump areas, and said method further comprising, after said exposing the first gold plating layer, a dicing step in which said plurality of the semiconductor devices are divided into package units, said each package unit including one semiconductor device.

11. The method of manufacturing the semiconductor device package as set forth in claim 1, wherein the semiconductor device comprises first and second terminals formed on opposite surfaces of said semiconductor device, respectively, and the connection bumps are two, and wherein the step of mounting the semiconductor device on the conductive substrate comprises the sub-steps of:

mounting the semiconductor device on the conductive substrate so that said first terminal of the semiconductor device is directly connected to one connection bump; and connecting the second terminal of the semiconductor device to the other connection bump by a wire.

* * * * *